United States Patent
Shim et al.

(10) Patent No.: US 9,396,800 B2
(45) Date of Patent: Jul. 19, 2016

(54) MEMORY SYSTEM AND PROGRAMMING METHOD THEREOF

(71) Applicant: Samsung Electronics Co., Ltd., Suwon-si (KR)

(72) Inventors: Sang-Won Shim, Seoul (KR); Sang-Wan Nam, Hwaseong-si (KR); Kitae Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/858,120

(22) Filed: Sep. 18, 2015

(65) Prior Publication Data

US 2016/0012898 A1    Jan. 14, 2016

Related U.S. Application Data

(63) Continuation of application No. 14/060,633, filed on Oct. 23, 2013, now Pat. No. 9,142,313.

(30) Foreign Application Priority Data

Feb. 20, 2013   (KR) ........................ 10-2013-0018062

(51) Int. Cl.
| | |
|---|---|
| *G11C 16/06* | (2006.01) |
| *G11C 16/10* | (2006.01) |
| *G11C 16/34* | (2006.01) |
| *G11C 16/04* | (2006.01) |
| *G11C 16/26* | (2006.01) |

(52) U.S. Cl.
CPC ............ *G11C 16/10* (2013.01); *G11C 16/0483* (2013.01); *G11C 16/26* (2013.01); *G11C 16/3427* (2013.01); *G11C 16/3459* (2013.01)

(58) Field of Classification Search
USPC ................................................ 365/185.22
See application file for complete search history.

(56) References Cited

U.S. PATENT DOCUMENTS

| | | | |
|---|---|---|---|
| 7,349,258 B2 | 3/2008 | Fong et al. | |
| 7,369,437 B2 | 5/2008 | Kamei | |
| 7,460,403 B2 | 12/2008 | Lee | |
| 7,760,550 B2 | 7/2010 | Fayrushin et al. | |
| 7,787,306 B2 | 8/2010 | Park et al. | |
| 7,852,676 B2 | 12/2010 | Maejima | |
| 8,107,286 B2 | 1/2012 | Itagaki et al. | |
| 8,107,292 B2 | 1/2012 | Maejima | |
| 8,391,075 B2 | 3/2013 | Fujiki et al. | |
| 2009/0268523 A1* | 10/2009 | Maejima ................. | G11C 5/02 365/185.11 |
| 2009/0268524 A1 | 10/2009 | Maejima | |
| 2011/0317489 A1 | 12/2011 | Kim et al. | |
| 2012/0039130 A1 | 2/2012 | Yoon et al. | |
| 2012/0201080 A1 | 8/2012 | Kang et al. | |
| 2012/0224426 A1 | 9/2012 | Nam et al. | |
| 2013/0343130 A1 | 12/2013 | Chen et al. | |

* cited by examiner

*Primary Examiner* — Hoai V Ho

(74) *Attorney, Agent, or Firm* — Muir Patent Law, PLLC

(57) ABSTRACT

A program method of a nonvolatile memory device is provided, which includes programming a memory cell in one string selected from a plurality of vertical strings; determining whether a mode of operation of the nonvolatile memory device is a pre-pulse mode; when the mode of operation is determined to be the pre-pulse mode, applying a pre-pulse having a predetermined level to a string selection line connected with a gate of a string selection transistor of at least one unselected vertical string of the plurality of vertical strings for a particular time period; and performing a verification operation on the programmed memory cell.

22 Claims, 10 Drawing Sheets

MEMORY SYSTEM AND PROGRAMMING METHOD THEREOF

CROSS-REFERENCE TO RELATED APPLICATIONS

This application is a Continuation of U.S. patent application Ser. No. 14/060,633, filed on Oct. 23, 2013, which claims for priority under 35 U.S.C. §119 to Korean Patent Application No. 10-2013-0018062 filed Feb. 20, 2013, in the Korean Intellectual Property Office, the entire contents of each of which are hereby incorporated by reference.

BACKGROUND

This disclosure relates to a memory system and a program method thereof. Semiconductor memory devices may be volatile or nonvolatile. A nonvolatile semiconductor memory device may retain data stored therein even at power-off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries.

In one type of memory, a vertical NAND flash memory, a plurality of strings may be connected with a bit line. A selected string and unselected strings may exist at a read or program operation. In the event that a read operation is performed under such a condition that boosting charges of unselected strings are not removed, the probability that read disturbance is generated by hot carrier injection may be high. In general, to remove such boosting charges, a pre-pulse may be applied during a predetermined time before a read operation. For example, one technique of applying a pre-pulse is disclosed in U.S. Pat. Nos. 7,852,676 and 8,107,292, the contents of which are incorporated herein in their entirety. However, the application of pre-pulses tends to slow down the processing speed for a memory, which can be undesirable.

SUMMARY

In one embodiment, a program method of a nonvolatile memory device is provided. The nonvolatile memory device may include a plurality of strings connected to a bit line, each string including at least one string selection transistor, a plurality of memory cells, and at least one ground selection transistor formed in a direction perpendicular to a substrate. The program method includes programming a memory cell in a first string selected from the plurality of strings; determining whether a mode of operation of the nonvolatile memory device is a pre-pulse mode; when the mode of operation is determined to be the pre-pulse mode, applying a pre-pulse having a particular level to a string selection line connected with a gate of a string selection transistor of at least one unselected string of the plurality of strings for a particular time period; and performing a verification operation on the programmed memory cell.

In example embodiments, each of the plurality of strings is connected between the bit line and a common source line and is formed in a direction perpendicular to the substrate.

In example embodiments, information indicating whether the mode of operation is the pre-pulse mode is provided from an external device.

In example embodiments, the information is one or more mode selection bits and the mode of operation is selected to be one of the pre-pulse mode or the not pre-pulse mode in response to a user request.

In example embodiments, the mode of operation is determined to be the pre-pulse mode when securing integrity of data at a read operation is selected over improvement of a program speed.

In example embodiments, the pre-pulse mode is selected based on a number of program loops exceeding a particular threshold.

In example embodiments, the pre-pulse mode is selected according to whether an off cell is detected at a previous verification operation.

In example embodiments, the particular time period for which the pre-pulse is applied is varied according to a target state of the memory cell. For example, in one embodiment, the time period is selected to be longer when the target state of the memory cell has a higher level, and is selected to be shorter when the target state of the memory cell has a lower level.

In one embodiment, a memory system includes at least one nonvolatile memory device including memory blocks where a plurality of strings connected with a bit line is formed in a direction perpendicular to a substrate; and a memory controller configured to control the at least one nonvolatile memory device. The at least one nonvolatile memory device includes a pre-pulse controller to control a pre-pulse according to pre-pulse mode information. The pre-pulse is applied to unselected string selection lines during a particular time period to remove boosting channels of unselected strings of the plurality of strings.

In example embodiments, the pre-pulse mode information is generated in the nonvolatile memory device.

In example embodiments, the pre-pulse mode information is generated from the memory controller.

In example embodiments, the pre-pulse controller is configured to not apply the pre-pulse at a verification operation of a program mode of operation.

In example embodiments, the pre-pulse controller is configured to apply the pre-pulse to the unselected string selection lines when a number of program loops exceeds a predetermined value at a verification operation of a program mode of operation.

In example embodiments, the pre-pulse controller is configured to apply the pre-pulse to the unselected string selection lines at a read mode of operation.

In example embodiments, the pre-pulse controller is configured to adjust the particular time period for which the pre-pulse is applied, according to a target state at a program operation or a read operation.

In one embodiment, a controller is provided for controlling whether to apply a pre-pulse to unselected string selection lines of a nonvolatile memory device in which a plurality of strings are connected to a bit line, each string including at least one string selection transistor, a plurality of memory cells, and at least one ground selection transistor formed in a direction perpendicular to a substrate. The controller is configured to: determine whether to apply a pre-pulse to at least one unselected string selection line of the nonvolatile memory device; when it is determined to apply the pre-pulse, apply the pre-pulse to the string selection line at a read mode or write mode of operation; and when it is determined not to apply the pre-pulse, not apply the pre-pulse to the string selection line. The determination is based on one or more of: an instruction indicating that a pre-pulse mode should be used; and a metric associated with the programming of the memory device.

The instruction may be received from another controller and may be based on a user selection.

The metric may be a particular number of program loops.

In one embodiment, the controller is further configured to: determine a time period for which the pre-pulse should be applied, based on an amount of voltage being applied to a selected string selection line adjacent the unselected string selection line.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
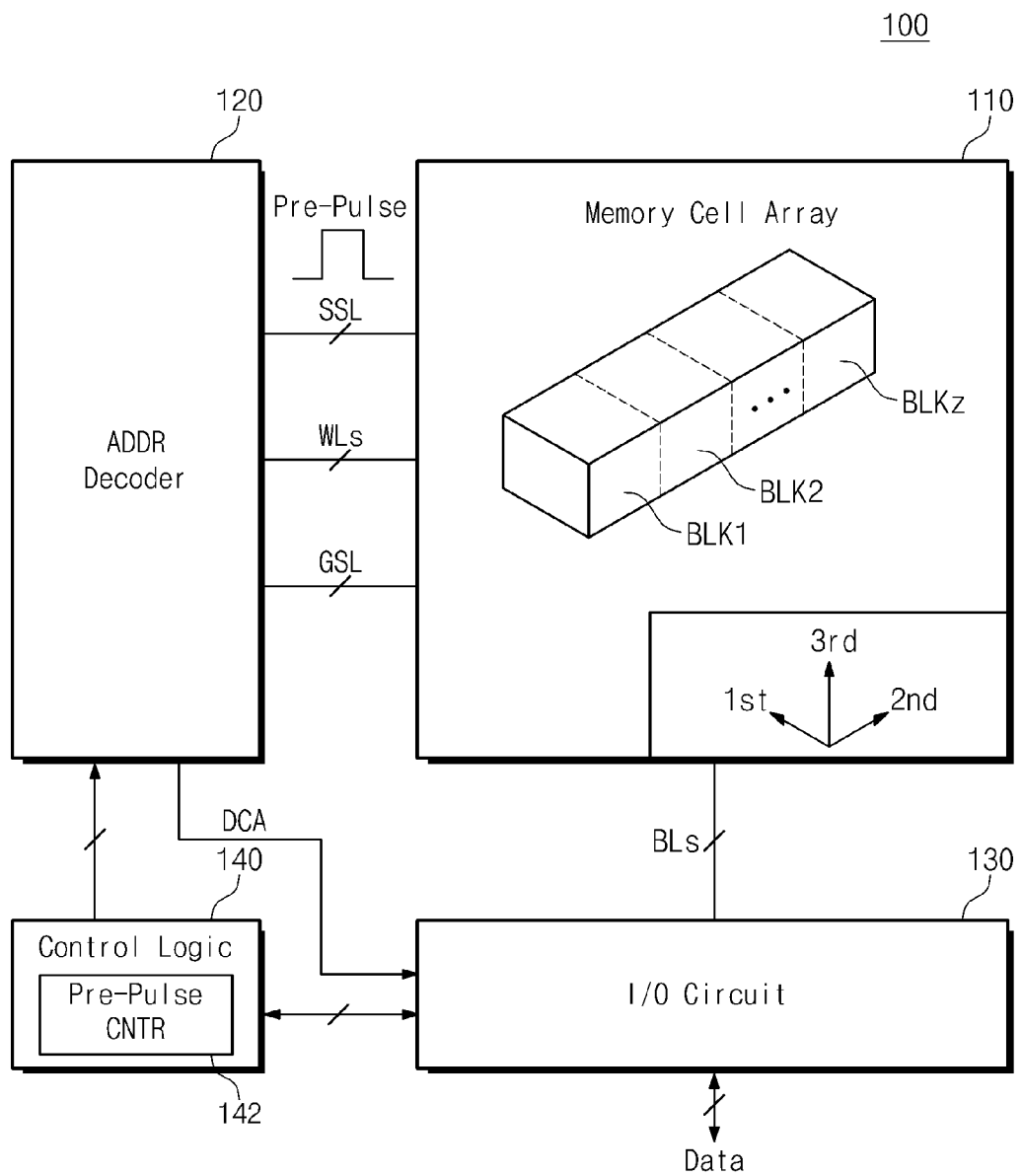
FIG. 1 is a block diagram schematically illustrating a nonvolatile memory device according to one exemplary embodiment.

Embodiments will be described in detail with reference to the accompanying drawings. The inventive concept, however, may be embodied in various different forms, and should not be construed as being limited only to the illustrated embodiments. Known processes, elements, and techniques are not described with respect to some of the disclosed embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to one exemplary embodiment. Referring to FIG. 1, a nonvolatile memory device 100 may include a memory cell array 110, an address decoder 120, an input/output circuit 130, and control logic 140.

In one embodiment, the memory cell array 110 is connected to the address decoder 120 through word lines, at least one string selection line SSL, and at least one ground selection line GSL. The memory cell array 110 may be connected to the input/output circuit 130 through bit lines. The memory cell array 110 may include a plurality of memory blocks BLK1 to BLKz.

Each of the memory blocks BLK1 to BLKz may include a plurality of strings which are arranged along a first direction and a second direction different from the first direction and along a third direction (for example, a direction perpendicular to a plane formed in the first and second directions) to have a three-dimensional structure. Each string may include at least one string selection transistor, a plurality of memory cells, and at least one ground selection transistor stacked on a substrate. Each memory cell may store at least one data bit.

The address decoder 120 may be connected to the memory cell array 110 through the word lines, the string selection line SSL and the ground selection line GSL. The address decoder 120 may select the word lines, the string selection line SSL and the ground selection line GSL using a decoded row address. The address decoder 120 may decode a column address of an input address ADDR. The decoded column address DCA may be provided to the input/output circuit 130. In example embodiments, the address decoder 120 may include a row decoder, a column decoder, an address buffer, and so on.

The input/output circuit 130 may be connected to the memory cell array 110 through the bit lines. The input/output circuit 130 may be configured to receive the decoded column address DCA from the address decoder 120. The input/output circuit 130 may select the bit lines using the decoded column address DCA.

The input/output circuit 130 may receive data from an external device (e.g., a memory controller) to store it at the memory cell array 110. The input/output circuit 130 may read data from the memory cell array 110 to output it to the external device. In addition, the input/output circuit 130 may read data from a first area of the memory cell array 110 to store it at a second area of the memory cell array 110. For example, the input/output circuit 130 may be configured to perform a copy-back operation.

In one embodiment, the control logic 140 controls an overall operation of the nonvolatile memory device 100 including a program operation, a read operation, an erase operation, and so on. The control logic 140 may operate in response to control signals or command provided from the external device. In one embodiment, the control logic 140 may include a pre-pulse controller 142 to control a pre-pulse. The pre-pulse may be applied to a string selection line connected to a gate of a string selection transistor in an unselected string. It may be applied at a particular time and for a particular time period. The particular time may be a predetermined time and the particular time period may be a predetermined time period. The pre-pulse may be applied to remove boosting charges of the unselected string at a read or verification operation. The pre-pulse may have a particular level. For example, the pre-pulse may have a predetermined voltage level. The boosting charges of the unselected string may cause hot carrier injection, so that read disturbance is generated at a read or verification operation. Therefore, removing the boosting charges may reduce or eliminate read disturbance.

The pre-pulse controller 142 may determine whether or not to apply a pre-pulse, and may determine an applying time period for the pre-pulse. In example embodiments, the pre-pulse controller 142 may be configured to apply the pre-pulse according to a mode. For this, the pre-pulse controller 142 may include a mode register for storing a mode directing the application of the pre-pulse. In example embodiments, the pre-pulse controller 142 may be configured to control/adjust/vary a pre-pulse applying time according to, for example, a read level or a verification level. For example, a pre-pulse applying time when a read level or a verification level is relatively high may be longer than that when a read level or a verification level is not relatively high (e.g., lower). As such, a time period for a pre-pulse signal may be selected to be longer when a target state of a memory cell being read or verified has a higher voltage, and may be selected to be shorter (relatively speaking) when the target state of the memory cell has a lower voltage. In one embodiment, the time periods may be selected, for example, based on a lookup table or register storing a correlation between voltage levels and pre-pulse time periods. However, this particular example is not intended to be limiting of the inventive concept.

The nonvolatile memory device 100 according to one embodiment may thus control the pre-pulse to optimize a read or verification operation (or, a program operation).

Figure 2:
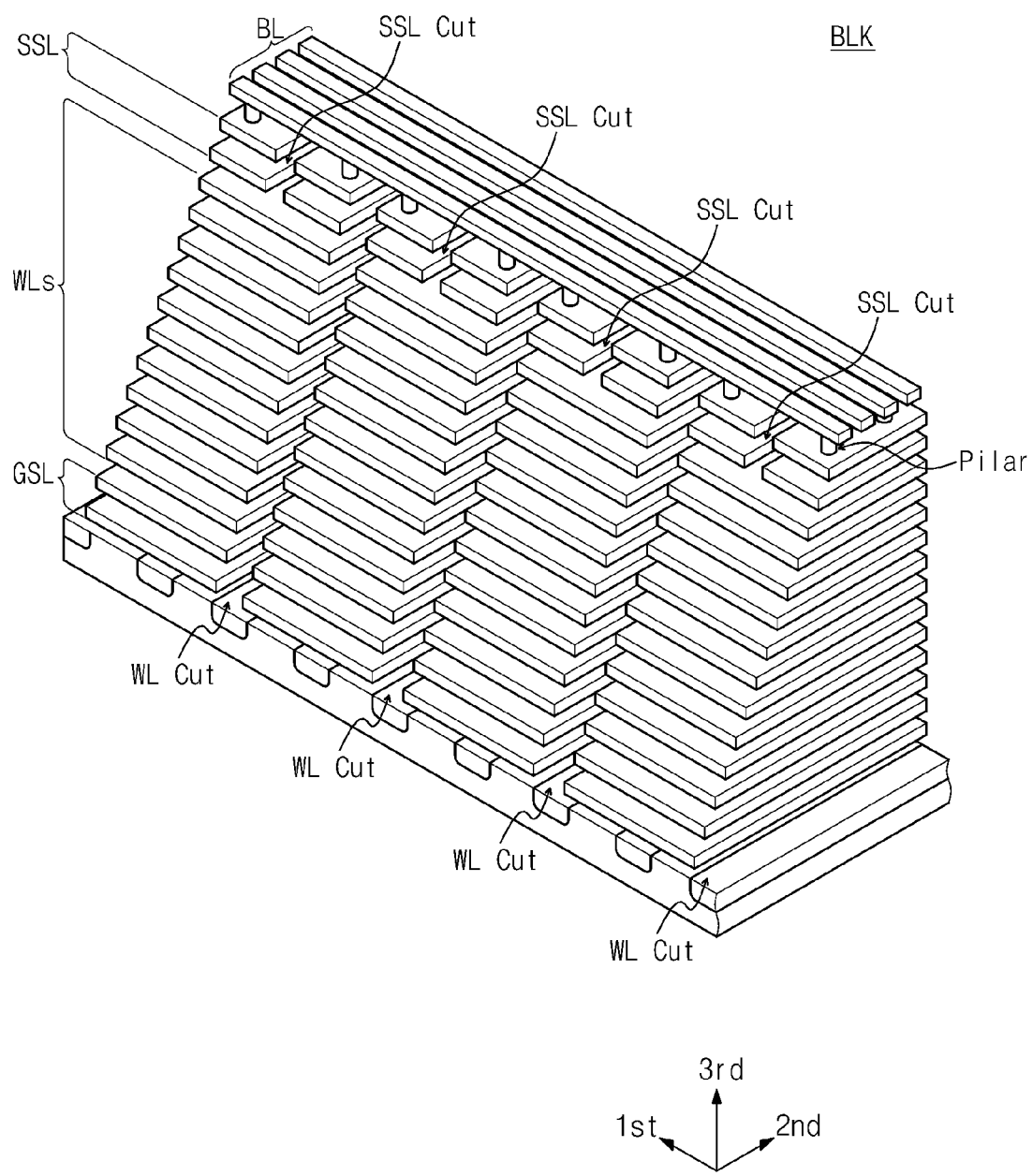
FIG. 2 is an exemplary perspective view of a memory block of FIG. 1.

FIG. 2 is an exemplary perspective view of a memory block BLK of FIG. 1. Referring to FIG. 2, four sub blocks may be formed on a substrate. Each sub block may be formed by stacking at least one ground selection line GSL, a plurality of word lines, and at least one string selection line SSL in a plate shape on the substrate between word line cuts. The string selection line SSL may be separated by string selection line cuts. Although not shown in FIG. 2, each word line cut may include a common source line CSL. In example embodiments, the common source lines CSL included in the word line cuts may be interconnected. A string may be formed by making a pillar connected with a bit line penetrate the at least one string selection line SSL, the word lines, and the at least one ground selection line GSL.

In FIG. 2, a structure between word line cuts may be a sub block. However, the inventive concept is not limited thereto. For example, a structure between a word line cut and a string selection line cut may be a sub block.

In certain embodiments, a memory block BLK may be implemented to have a merged word line structure where two word lines are merged to one.

Figure 3:
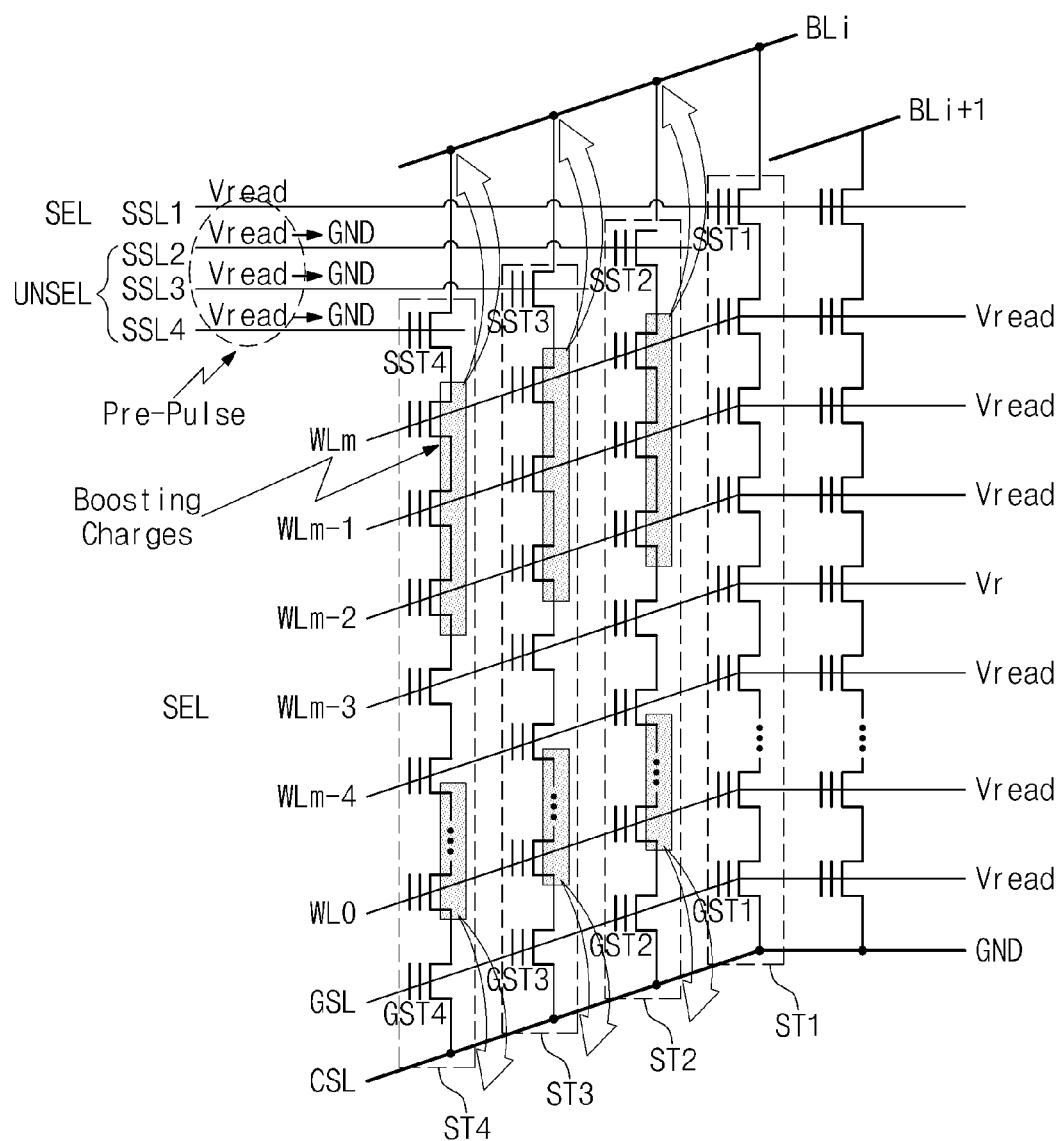
FIG. 3 is a diagram schematically illustrating a boosting charge removing method using a pre-pulse at a read operation of a nonvolatile memory device according to one exemplary embodiment.

FIG. 3 is a diagram schematically illustrating a boosting charge removing method using a pre-pulse at a read operation of a nonvolatile memory device 100, according to one exemplary embodiment. In FIG. 3, there is illustrated a read operation on memory cells corresponding to a word line WLm-3 and a string selection line SSL1. For ease of description, it is assumed that a bit line BLi is connected with four strings ST1 to ST4. As shown in the example of FIG. 3, the string ST1 is a selected string, and the remaining strings ST2 to ST4 are unselected strings. Boosting charges (corresponding to gray portions) of the unselected strings ST2 to ST4 may be removed in a bit line direction or a common source line direction before a sensing operation is executed.

For example, boosting charges may be removed in a bit line direction using a pre-pulse. The pre-pulse illustrated in FIG. 3 may include, for example, applying a read pass voltage Vread to string selection lines SSL2, SSL3 and SSL4 during a particular time period. As string selection transistors SST2, SST3 and SST4 of the strings ST2, ST3 and ST4 are turned on during the time period, boosting charges of string channels may be discharged to a bit line BLi. After boosting charges are removed in the bit line direction, a ground voltage GND may be applied to the string selection lines SSL2, SSL3 and SSL4 to isolate the bit line BLi from the strings ST2, ST3 and ST4. In the example of FIG. 3, a level of the pre-pulse may be equal to that of the read pass voltage Vread. However, the inventive concept is not limited thereto.

Boosting charges may be removed in a common source line direction by turning on ground selection transistors GST2, GST3 and GST4 of the strings ST2, ST3 and ST4. For example, boosting charges may be discharged to a common source line CSL by applying the read pass voltage Vread to a ground selection line GSL connected in common to gates of the ground selection transistors GST2, GST3 and GST4.

As described above, after boosting charges are removed, bit lines BLi and BLi+1 may be pre-charged, a read voltage Vr may be applied to a selected word line WLm-3, and the read pass voltage Vread may be applied to the remaining word lines WL0 to WLm-4 and WLm-2 to WLm. Under this bias condition, a sensing operation may be performed to sense on/off states of memory cells corresponding to the selected word line WLm-3 and the selected string selection line SSL1.

With the read operation described herein, it is possible to remove boosting charges of unselected strings (e.g., ST2 to ST4) using a pre-pulse.

A method of removing boosting charges using the pre-pulse may not be limited to a read operation. For example, the method is also applicable to a verification operation of a program operation.

Figure 4:
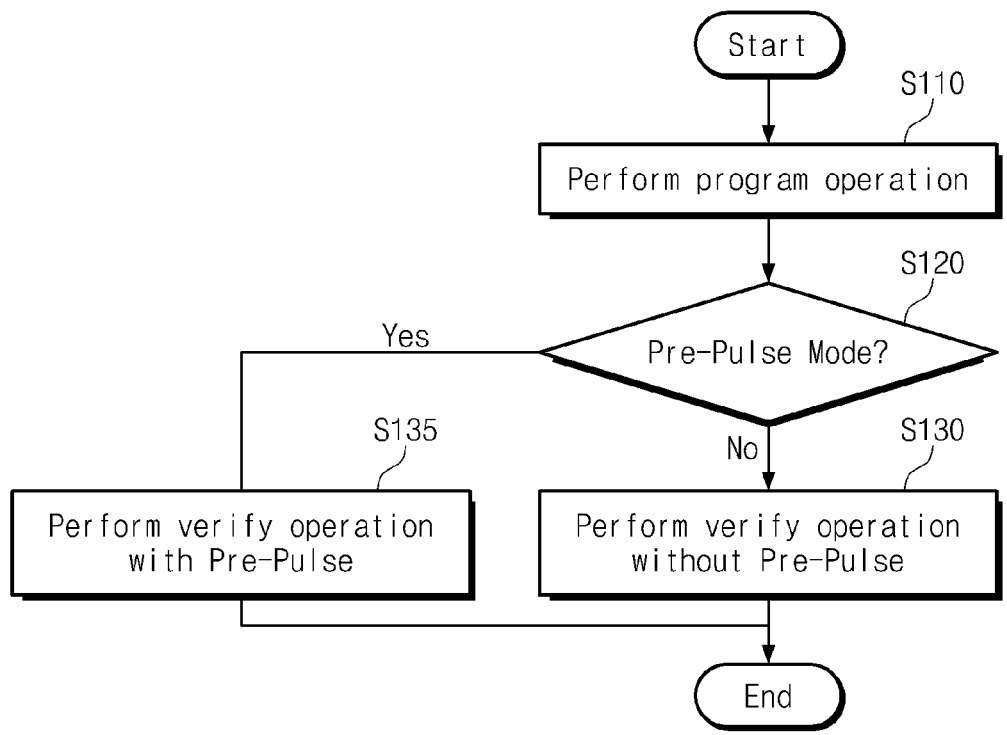
FIG. 4 is a flow chart schematically illustrating a program method of a nonvolatile memory device according to one exemplary embodiment.

FIG. 4 is a flow chart schematically illustrating a program method of a nonvolatile memory device 100 according to one exemplary embodiment. Below, a program method of a nonvolatile memory device 100 according to one exemplary embodiment will be more fully described with reference to FIGS. 1 to 4.

In operation S110, memory cells corresponding to a selected word line and a selected string may be programmed. In operation S120, whether a mode of operation is a pre-pulse mode may be determined. For example, the pre-pulse mode may be decided by a value stored at a mode register. This value may be used as a specific indicator that designates whether the pre-pulses should be used or not. For example, in the event that integrity of data is required (a decrease in read disturbance is required), the mode register may be set such that the pre-pulse mode is performed. When a user requests integrity of data at a read operation, the mode register may be set in response to such a request. On the other hand, in the event that reduction of a program time is required, the mode register may be set such that the pre-pulse mode is not performed. Therefore, the pre-pulse mode may be selected based on a selection, or prioritization, between data integrity and program speed.

If a mode of operation is not the pre-pulse mode, in operation S130, a verification operation on the programmed memory cells may be performed without the pre-pulse. On the other hand, if a mode of operation is the pre-pulse mode, in operation S135, a verification operation on the programmed memory cells may be performed with the pre-pulse.

Accordingly, a verification operation may be performed using the pre-pulse selectively according to selection of a memory controller or a need of a user.

In one embodiment, whether to apply a pre-pulse is determined according to a predetermined condition at a program loop.

Figure 5:
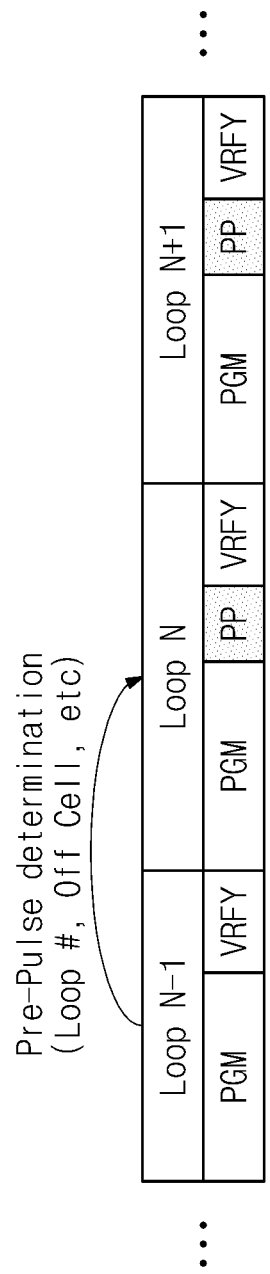
FIG. 5 is a diagram schematically illustrating program loops according to an exemplary program method of a nonvolatile memory device.

FIG. 5 is a diagram schematically illustrating exemplary program loops according to an exemplary program method of a nonvolatile memory device 100.

Referring to FIG. 5, a decision to apply a pre-pulse may be determined at a (N−1)th program loop. Then, as a program loops (e.g., if a voltage is incrementally applied to a word line in order to program it), whether to apply a pre-pulse may be determined according to a metric associated with the programming of the memory device, such as whether the number of program loops exceeds a predetermined value or whether an off cell (e.g., cell having erroneous data) is detected at a verification operation VRFY. In one embodiment, if applying of the pre-pulse at the (N−1)th program loop is decided, in each of next program loops Loop N, Loop N+1, etc., a pre-pulse may be applied after a program operation PGM is executed. After the pre-pulse is applied, a verification operation VRFY may be performed.

A nonvolatile memory device 100 according to one exemplary embodiment may change a time period (hereinafter, referred to as a pre-pulse time period) for which the pre-pulse is applied at a read/verification operation.

Figure 6:
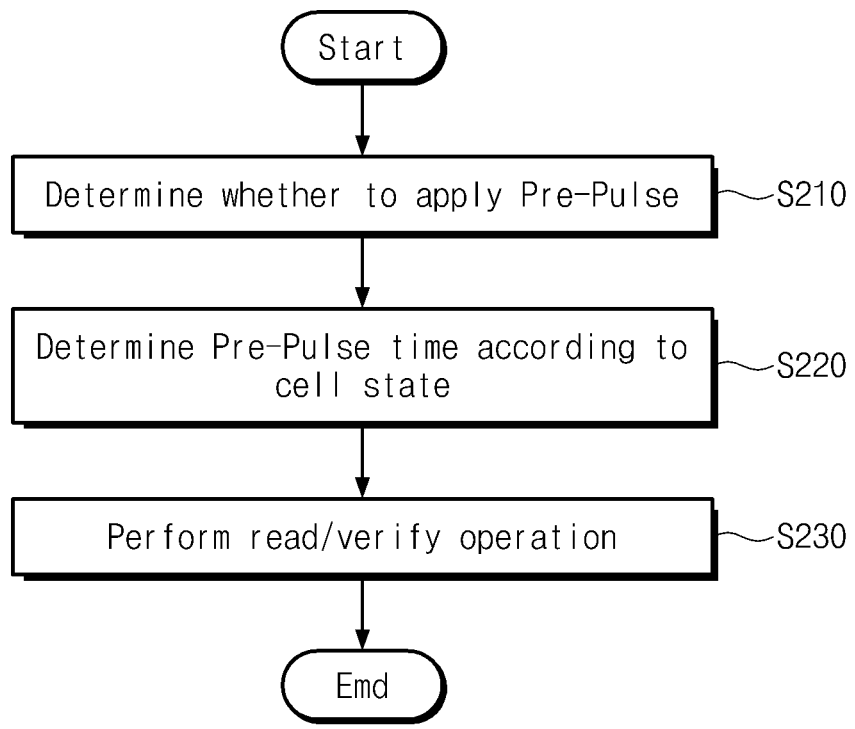
FIG. 6 is a flow chart schematically illustrating a read method of a nonvolatile memory device according to one exemplary embodiment.

FIG. 6 is a flow chart schematically illustrating a read method of a nonvolatile memory device 100 according to one exemplary embodiment. Below, a read method of a nonvolatile memory device 100 according to one embodiment will be more fully described with reference to FIGS. 1 and 6.

A pre-pulse controller 142 may determine whether to apply a pre-pulse to unselected strings via unselected string selection lines SSL2, SSL3 and SSL4. In the event that the pre-pulse is applied, in operation S220, the pre-pulse controller 142 may determine a pre-pulse time period according to a state of a target cell of a read/verification operation. The target cell may be a cell in the selected line. For example, a pre-pulse time period when a state of the target cell is closer to the uppermost state (e.g., a P3 state at a 2-bit program operation), which may be indicated by a higher voltage may be longer than that when a state of the target cell is not closer to the uppermost state (e.g., indicated by a lower voltage). In operation S230, a read/verification operation may be performed by applying a read/verification voltage to a selected word line WLm-3 after applying of the pre-pulse.

Therefore, the nonvolatile memory device 100 according to one exemplary embodiment may perform a read/verification operation where a pre-pulse time period is varied according to a state of a target cell.

FIG. 6 shows an example where a pre-pulse time period is varied according to a state of a target cell at a read/verification operation. However, the inventive concept is not limited thereto. For example, a pre-pulse level (e.g., voltage level) can also be varied according to a state of a target cell at a read/verification operation.

In one embodiment, the pre-pulse controller 142 may be configured to control a pre-pulse based on pre-pulse mode information provided from an external device (e.g., a memory controller).

Figure 7:
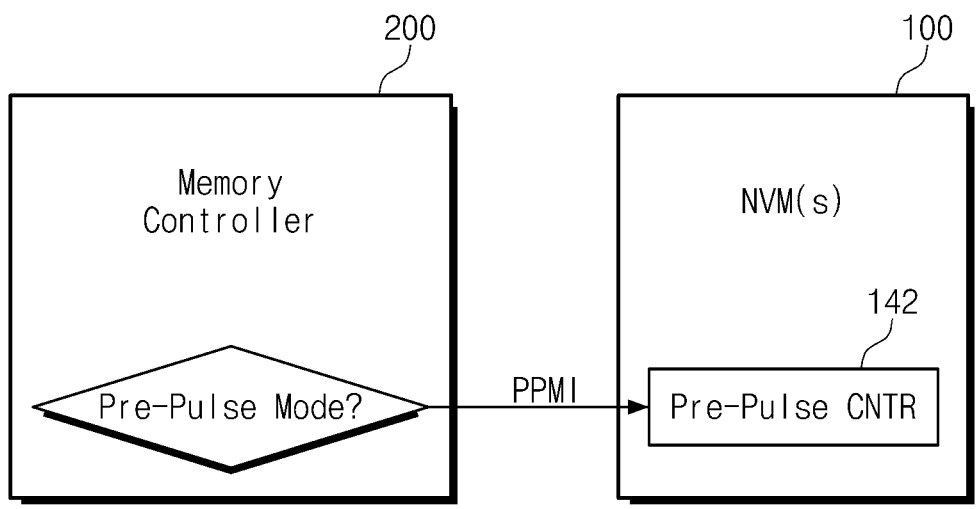
FIG. 7 is a block diagram schematically illustrating a memory system according to an exemplary embodiment.

FIG. 7 is a block diagram schematically illustrating a memory system 10 according to one exemplary embodiment. Referring to FIG. 7, a memory system 10 may include at least one nonvolatile memory device 100 and a memory controller 200 controlling the at least one nonvolatile memory device 100. The memory controller 200 may determine whether to perform a pre-pulse mode at a read/verification operation. The memory controller 200 may send pre-pulse mode information PPMI (e.g., the information may include one or more mode selection bits) to the nonvolatile memory device 100 based on the determination result. A pre-pulse mode controller 142 of the nonvolatile memory device 100 may control whether to apply a pre-pulse and a change of a pre-pulse time, based on the pre-pulse mode information PPMI.

In certain embodiments, the above-described mode selection scheme may be applicable to a memory device such as a solid state drive (SSD).

Figure 8:
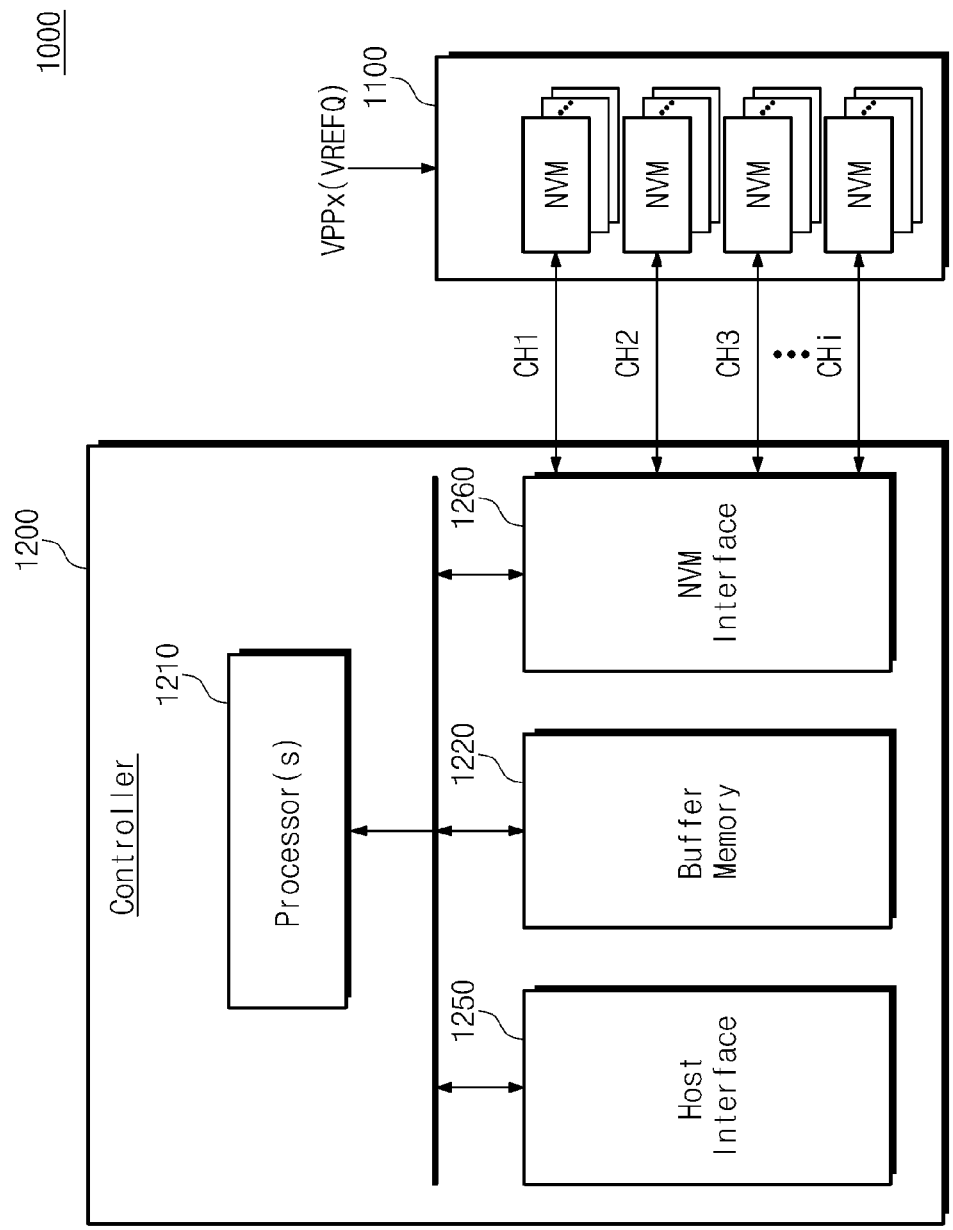
FIG. 8 is a block diagram schematically illustrating a solid state drive according to an exemplary embodiment.

FIG. 8 is a block diagram schematically illustrating a solid state drive according to one exemplary embodiment. Referring to FIG. 8, a solid state drive (hereinafter, referred to as SSD) 1000 may include a plurality of flash memory devices 1100 and an SSD controller 1200. The flash memory devices 1100 may be supplied with an external high voltage VPPx. Each of the flash memory devices 1100 may be implemented to perform a pre-pulse control method such as described with reference to FIGS. 1 to 7. The SSD controller 1200 may be connected to the flash memory devices 1100 through a plurality of channels CH1 to CHi (i being an integer of 2 or more). The SSD controller 1200 may include at least one processor 1210, a buffer memory 1220, a host interface 1250, and a flash interface 1260.

The SSD 1000 may be optimally driven by controlling a pre-pulse at a program operation and a read operation.

In certain embodiments, the above-described mode selection scheme may be applicable to an embedded MMC (hereinafter, referred to as eMMC).

Figure 9:
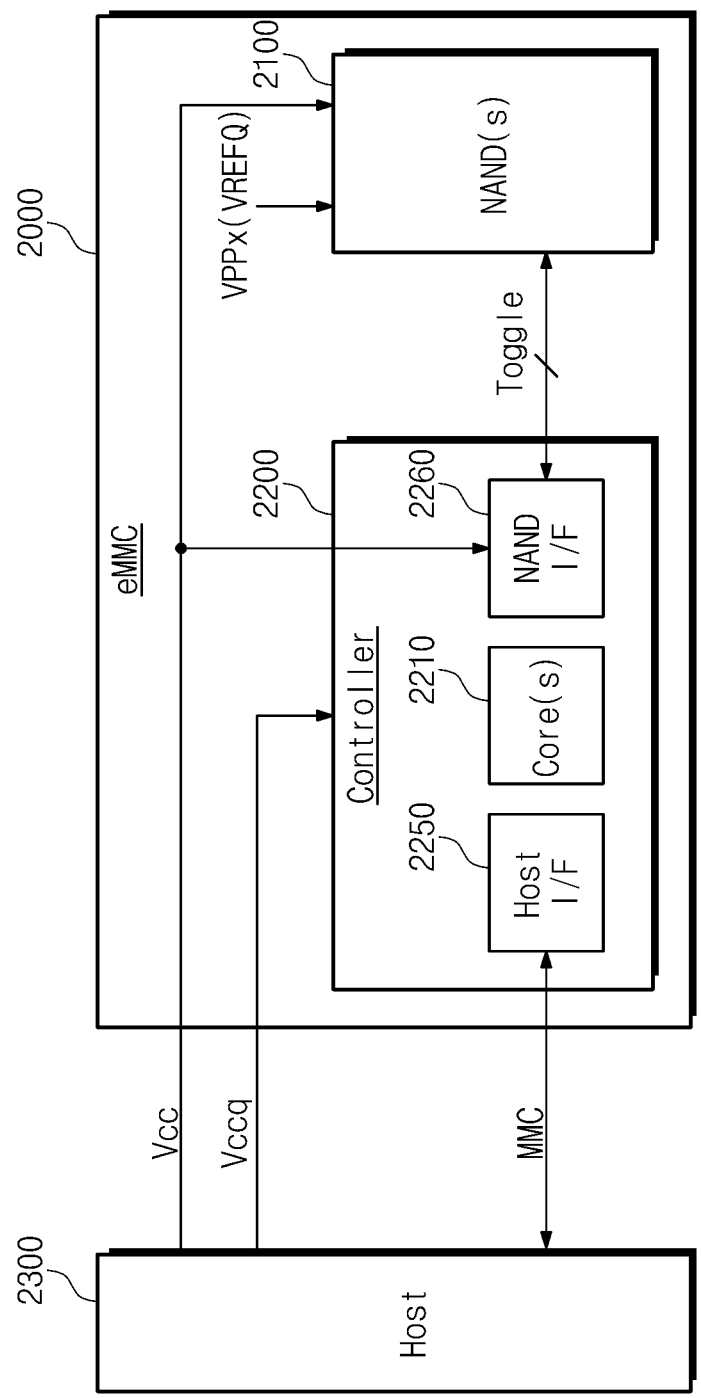
FIG. 9 is a block diagram schematically illustrating an eMMC according to an exemplary embodiment.

FIG. 9 is a block diagram schematically illustrating an exemplary eMMC according to one embodiment. Referring to FIG. 9, an eMMC 2000 may include at least one NAND flash memory device 2100 and a controller 2200. The NAND flash memory device 2100 may be a single data rate (SDR) NAND flash memory device or a double data rate (DDR) NAND flash memory device. In example embodiments, the NAND flash memory device 2100 may include NAND flash memory chips. The NAND flash memory device 2100 may be implemented by stacking the NAND flash memory chips at one package (e.g., FBGA, Fine-pitch Ball Grid Array, etc.). Each of the NAND flash memory devices may be implemented to perform a pre-pulse control method such as described with reference to FIGS. 1 to 7.

The controller 2200 may be connected with the NAND flash memory device 2100 via a plurality of channels. The controller 2200 may include at least one controller core 2210, a host interface 2250, and a NAND interface 2260. The controller core 2210 may control an overall operation of the eMMC 2000. The host interface 2250 may be configured to perform an interface between the controller 2200 and a host. The NAND interface 2260 may be configured to provide an interface between the NAND flash memory device 2100 and the controller 2200. In example embodiments, the host interface 2250 may be a parallel interface (e.g., an MMC interface). In other example embodiments, the host interface 2250 of the eMMC 2000 may be a serial interface (e.g., UHS-II, UFS, etc.).

The eMMC 2000 may receive power supply voltages Vcc and Vccq from the host. The power supply voltage Vcc (e.g., about 3.3V) may be supplied to the NAND flash memory device 2100 and the NAND interface 2260, and the power supply voltage Vccq (e.g., about 1.8V/3.3V) may be supplied to the controller 2200.

The eMMC 2000 according to an exemplary embodiment is applicable to small-sized and low-power mobile products (e.g., Galaxy S™ series, Galaxy note™ series, iPhone™, iPad™, Nexus™, etc.).

In certain embodiments, the above-described mode selection scheme may be applicable to universal flash storage UFS.

Figure 10:
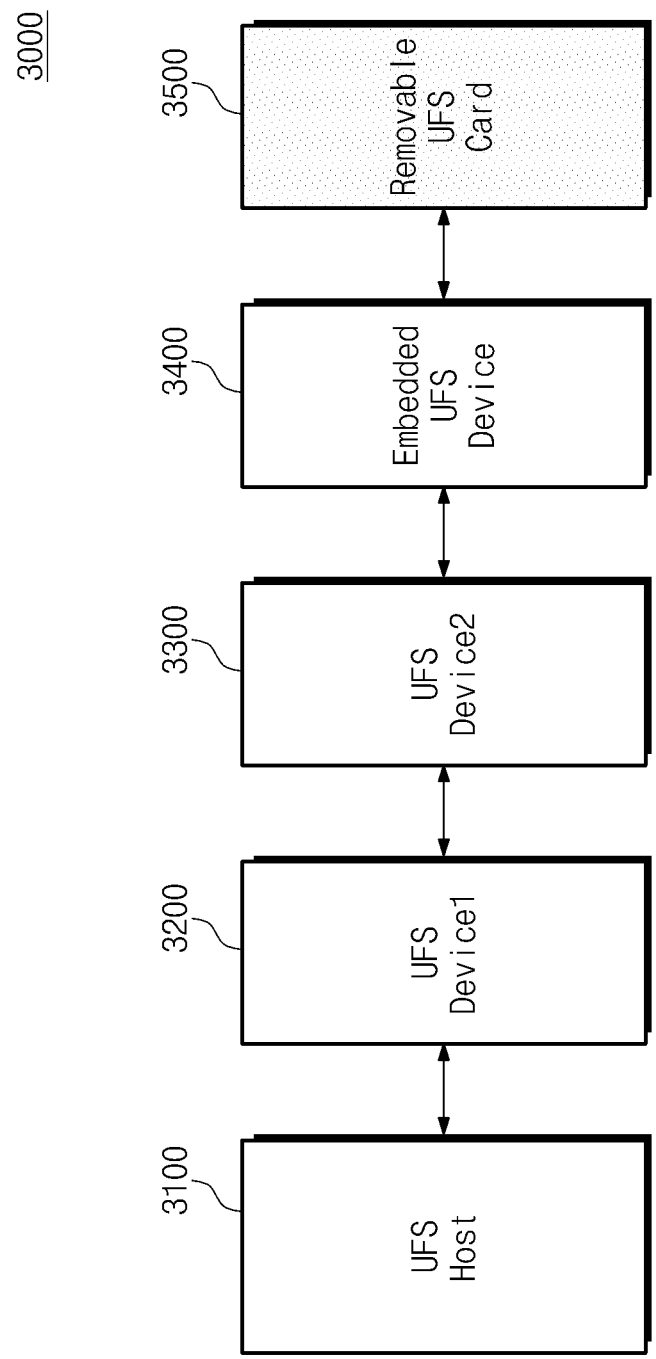
FIG. 10 is a block diagram schematically illustrating a UFS system according to an exemplary embodiment.

FIG. 10 is a block diagram schematically illustrating an exemplary UFS system 3000 according to one embodiment. Referring to FIG. 10, a UFS system 3000 may include a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may include a nonvolatile memory device 100, for example, as described in connection with FIG. 1.

The embedded UFS device 3400 and the removable UFS card 3500 may perform communications using protocols different from the UFS protocol. The UFS host 3100 and the removable UFS card 3500 may communicate through various card protocols (e.g., UFDs, MMC,SD (secure digital), mini SD, Micro SD, etc.).

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A nonvolatile memory device comprising:
a memory cell array including a plurality of strings including a first string and a second string that are connected to a bit-line, each of the plurality of strings including a string selection transistor (SST) and a plurality of serially-connected nonvolatile memory cells being stacked on or above a substrate in a direction that is perpendicular to the substrate, the SST of the first string being connected to a first string selection line (SSL), the SST of the second string being connected to a second SSL, a first memory cell among the plurality of serially-connected nonvolatile memory cells of the first string and a second memory cell among the plurality of serially-connected nonvolatile memory cells of the second string being connected to a first word-line; and
a control logic configured to control a program-verification operation and a read operation on the first memory cell, and to determine whether an operation mode for each of the program-verification operation and the read operation on the first memory cell is a pre-pulse mode,
wherein the operation mode for the program-verification operation on the first memory cell is different from the operation mode for the read operation on the first memory cell, and
when the operation mode for the program-verification operation or the read operation on the first memory cell is the pre-pulse mode, during applying to the first SSL a first voltage that turns-on the first SST, a second voltage that turns-on the second SST is applied to the second SSL for a first time period, and then the program-verification operation or the read operation on the first memory cell is performed during applying to the second SSL a third voltage that isolates the bit-line from the second string.

2. The nonvolatile memory device of claim 1, wherein the plurality of serially-connected nonvolatile memory cells of the first string include a third memory cell,
the plurality of serially-connected nonvolatile memory cells of the second string include a fourth memory cell,
the third memory cell and the fourth memory cell are connected to a second word-line, and
each of the read operation and the program-verification operation comprises:
applying a selected voltage to the first word-line;
applying an unselected voltage higher than the selected voltage to the second word-line during the applying the selected voltage to the first word-line; and
applying to the first SSL a fourth voltage that turns-on the first SST during the applying the selected voltage to the first word-line.

3. The nonvolatile memory device of claim 2, wherein the operation mode for the read operation on the first memory cell is the pre-pulse mode, and the operation mode for the program-verification operation on the first memory cell is not the pre-pulse mode.

4. The nonvolatile memory device of claim 3, wherein the first string includes a first ground selection transistor (GST) connected a ground selection line (GSL) and the second string includes a second GST connected to the GSL, and
for the read operation, during applying the second voltage to the second SSL, a fifth voltage that turns-on the first GST and the second GST is applied to the GSL.

5. The nonvolatile memory device of claim 3, wherein the third voltage is equal to a ground voltage, and the first voltage is equal to the second voltage and the fourth voltage.

6. The nonvolatile memory device of claim 5, wherein the first voltage is equal to the unselected voltage.

7. The nonvolatile memory device of claim 3, wherein the program-verification operation on the first memory cell is performed, without applying the second voltage to the second SSL during the applying the first voltage to the first SSL.

8. The nonvolatile memory device of claim 3, wherein information indicating whether the operation mode for the program-verification operation or the read operation on the first memory cell is the pre-pulse mode is provided from an external device.

9. A nonvolatile memory device comprising:
a memory cell array including a plurality of strings including a first string and a second string that are connected to a bit-line, each of the plurality of strings including a string selection transistor (SST) and a plurality of serially-connected nonvolatile memory cells being stacked on or above a substrate in a direction that is perpendicular to the substrate, the SST of the first string being connected to a first string selection line (SSL), the SST of the second string being connected to a second SSL, the plurality of serially-connected nonvolatile memory cells of the first string including a first memory cell and a second memory cell, the plurality of serially-connected nonvolatile memory cells of the second string including a third memory cell and a fourth memory cell, the first memory cell and the third memory cell being connected to a first word-line, the second memory cell and the fourth memory cell being connected to a second word-line; and
a control logic configured to control a first read or program-verification operation on the first memory cell, to control a second read or program-verification operation on the second memory cell, to determine whether an operation mode for the first read or program-verification is a pre-pulse mode, and to determine whether the operation mode for the second read or program-verification operation is the pre-pulse mode,
wherein the operation mode for the first read or program-verification operation on the first memory cell is different from the operation mode for the second read or program-verification operation on the second program-verification operation on the second memory cell, and
when the operation mode for the first read or program-verification operation on the first memory cell is the pre-pulse mode, during applying to the first SSL a first voltage that turns-on the first SST, a second voltage that turns-on the second SST is applied to the second SSL for a first time period, and then the first read operation or the first program-verification operation on the first memory cell is performed during applying to the second SSL a third voltage that isolates the bit-line from the second string.

10. The nonvolatile memory device of claim 9, wherein the plurality of serially-connected nonvolatile memory cells of the first string include a third memory cell,
the plurality of serially-connected nonvolatile memory cells of the second string include a fourth memory cell,
the third memory cell and the fourth memory cell are connected to a second word-line, and
each of the first read or program-verification operation and the second read or program-verification operation comprises:
applying a selected voltage to the first word-line or the second word-line;

applying an unselected voltage higher than the selected voltage to the third word-line during the applying the selected voltage to the first word-line or the second word-line; and
applying a fourth voltage that turns-on the first SST to the first SSL during the applying the selected voltage to the first word-line.

11. The nonvolatile memory device of claim 10, wherein information indicating whether the operation mode for the first read or program-verification operation on the first memory cell is the pre-pulse mode is provided from an external device.

12. The nonvolatile memory device of claim 10, wherein the third voltage is equal to a ground voltage, and
the first voltage is equal to the second voltage and the fourth voltage.

13. The nonvolatile memory device of claim 12, wherein the first voltage is equal to the unselected voltage.

14. The nonvolatile memory device of claim 10, wherein the first string includes a first ground selection transistor (GST) connected a ground selection line (GSL) and the second string includes a second GST connected to the GSL, and
during applying the second voltage to the second SSL, a fifth voltage that turns-on the first GST and the second GST is applied to the GSL.

15. The nonvolatile memory device of claim 10, wherein the operation mode for the second read or program-verification operation on the second memory cell is not the pre-pulse mode, the second read or program-verification operation on the second memory cell is performed, without applying the second voltage to the second SSL during the applying the first voltage to the first SSL.

16. The nonvolatile memory device of claim 15, wherein the selected voltage applied to the first word-line during the first read or program-verification operation is different from the selected voltage applied to the first word-line during the second read or program-verification operation.

17. A nonvolatile memory system comprising:
a nonvolatile memory device including a plurality of strings including a first string and a second string that are connected to a bit-line, each of the plurality of strings including a string selection transistor (SST) and a plurality of serially-connected nonvolatile memory cells being stacked on or above a substrate in a direction that is perpendicular to the substrate, the SST of the first string being connected to a first string selection line (SSL), the SST of the second string being connected to a second SSL, a first memory cell among the plurality of serially-connected nonvolatile memory cells of the first string and a second memory cell among the plurality of serially-connected nonvolatile memory cells of the second string being connected to a first word-line; and
a memory controller configured to provide program data and an address to the nonvolatile memory device,
wherein the nonvolatile memory device is configured to control a program-verification operation on the first memory cell based on the program data, to control a read operation on the first memory cell corresponding to the address, and to determine whether an operation mode for each of the program-verification operation and the read operation on the first memory cell is a pre-pulse mode,
the operation mode for the program-verification operation on the first memory cell is different from the operation mode for the read operation on the first memory cell, and
when the operation mode for the program-verification operation or the read operation on the first memory cell is the pre-pulse mode, during applying to the first SSL a first voltage that turns-on the first SST, a second voltage that turns-on the second SST is applied to the second SSL for a first time period, and then the program-verification operation or the read operation on the first memory cell is performed during applying to the second SSL a third voltage that isolates the bit-line from the second string.

18. The nonvolatile memory system of claim 17, wherein the plurality of serially-connected nonvolatile memory cells of the first string includes a third memory cell, the plurality of serially-connected nonvolatile memory cells of the second string includes a fourth memory cell, the third memory cell and the fourth memory cell are connected to the second word-line, and each of the read operation and the program-verification comprises:

applying a selected voltage to the first word-line;

applying an unselected voltage higher than the selected voltage to the second word-line during the applying the selected voltage to the first word-line; and applying a fourth voltage that turns-on the first SST to the first SSL during the applying the selected voltage to the first word-line.

19. The nonvolatile memory system of claim 18, wherein the operation mode for the read operation on the first memory cell is the pre-pulse mode, and the operation mode for the program-verification operation on the first memory cell is not the pre-pulse mode.

20. The nonvolatile memory system of claim 19, wherein the first string includes a first ground selection transistor (GST) connected a ground selection line (GSL) and the second string includes a second GST connected to the GSL, and for the read operation, during applying the second voltage to the second SSL, a fifth voltage that turns-on the first GST and the second GST is applied to the GSL.

21. The nonvolatile memory system of claim 20, wherein the third voltage is equal to a ground voltage, and all of the first voltage, the second voltage, the fourth voltage, the fifth voltage and the unselected voltage have the same voltage.

22. The nonvolatile memory system of claim 19, wherein information indicating whether the operation mode for the read operation on the first memory cell is the pre-pulse mode is provided from the memory controller to the nonvolatile memory device.

\* \* \* \* \*